(12) United States Patent
Bowes

(10) Patent No.: US 6,730,444 B2
(45) Date of Patent: May 4, 2004

(54) NEEDLE COMB RETICLE PATTERN FOR CRITICAL DIMENSION AND REGISTRATION MEASUREMENTS USING A REGISTRATION TOOL AND METHODS FOR USING SAME

(75) Inventor: Steve W. Bowes, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/874,615

(22) Filed: Jun. 5, 2001

(65) Prior Publication Data

US 2002/0182516 A1 Dec. 5, 2002

(51) Int. Cl.[7] .................................................. G03F 9/00
(52) U.S. Cl. ......................... 430/5; 430/5; 430/22; 430/30; 430/312; 430/394; 430/396; 382/145; 382/149; 382/151
(58) Field of Search ..................... 430/22, 30, 312, 430/394, 396; 382/145, 149, 151

(56) References Cited

U.S. PATENT DOCUMENTS

| | | | |
|---|---|---|---|
| 4,908,656 A | * 3/1990 | Suwa et al. ................. 355/53 |
| 5,627,624 A | * 5/1997 | Yim et al. ................... 355/53 |
| 5,677,091 A | * 10/1997 | Barr et al. .................. 430/30 |
| 5,701,013 A | 12/1997 | Hsia et al. ................ 250/491.1 |
| 5,712,707 A | 1/1998 | Ausschnitt et al. .......... 356/401 |
| 5,757,507 A | 5/1998 | Ausschnitt et al. .......... 356/401 |
| 5,789,118 A | 8/1998 | Liu et al. ..................... 430/5 |
| 5,805,290 A | 9/1998 | Ausschnitt et al. .......... 356/401 |
| 5,953,128 A | 9/1999 | Ausschnitt et al. .......... 356/399 |
| 5,962,173 A | * 10/1999 | Leroux et al. ............... 430/22 |
| 5,976,740 A | 11/1999 | Ausschnitt et al. .......... 430/30 |
| 6,023,338 A | 2/2000 | Bareket ..................... 356/401 |
| 6,031,614 A | 2/2000 | Michaelis et al. ........... 356/369 |
| 6,063,530 A | 5/2000 | Grassmann ................. 430/30 |
| 6,068,954 A | * 5/2000 | David ........................ 430/22 |
| 6,088,113 A | * 7/2000 | Kim .......................... 355/53 |
| 6,365,302 B1 | * 4/2002 | Yang ........................... 430/5 |
| 6,396,569 B2 | * 5/2002 | Zheng et al. ............... 430/30 |

OTHER PUBLICATIONS

Ausschnitt et al., "Seeing the forest for the trees: a new approach to CD control", pp. 212–220, undated.
Kim et al., "Automatic In–situ Focus Monitor Using Line Shortening Effect", pp. 184–193, Mar. 1999.

* cited by examiner

Primary Examiner—Mark F. Huff
Assistant Examiner—Kripa Sagar
(74) Attorney, Agent, or Firm—TraskBritt

(57) ABSTRACT

Needle comb reticle patterns for use in both critical dimension analysis and registration analysis with a registration tool are disclosed. One embodiment of a needle comb reticle pattern includes a box-in-box feature flanked on two adjacent sides by needle combs with tapered flat-tipped needles. Another embodiment of a needle comb reticle pattern includes a box-in-box feature flanked on two adjacent sides by needle combs with tapered flat-tipped needles and flanked on the other two adjacent sides by reference bars. Yet another embodiment of a needle comb reticle pattern includes two complementary needle comb reticle subpatterns, each subpattern including a box-in-box feature with four flanking needle combs. A registration tool can be used with the needle combs and reference bars to measure critical dimension of a semiconductor process. The registration tool can also be used with the box-in-box feature to measure registration between two adjacent layers during semiconductor fabrication. Reticles, fields within reticles, masks and wafers including the needle comb reticle pattern of the present invention are also disclosed. Additionally, methods for analyzing critical dimension and registration and characterizing needle comb reticle measurements to critical dimension using the needle comb reticle patterns of the present invention are also disclosed.

48 Claims, 10 Drawing Sheets

NEEDLE COMB RETICLE PATTERN FOR CRITICAL DIMENSION AND REGISTRATION MEASUREMENTS USING A REGISTRATION TOOL AND METHODS FOR USING SAME

FIELD OF THE INVENTION

The present invention relates generally to metrology of semiconductor manufacturing processes. More particularly, the present invention is a needle comb reticle pattern for simultaneously making critical dimension (CD) measurements of device features and registration measurements of mask overlays relative to semiconductor wafers during processing of semiconductor wafers.

BACKGROUND OF THE INVENTION

Lithographic and etch processes used in semiconductor device manufacturing are subject to variations in exposure, focus and alignment. Generally, less variation in such semiconductor manufacturing processes leads to higher yields. Because of such process variations, patterns developed by lithographic processes must be continually monitored, or measured, to determine if the dimensions of the patterns are within acceptable ranges and to determine whether the multiple mask layers, or overlays, are properly aligned and not biased or skewed.

Conventionally, monitoring of pattern features and measurement of critical dimension (CD) may be performed using a scanning electron microscope (SEM) tool and/or an automatic force microscopy (AFM) tool. Pattern placement is measured with an optical registration tool. While SEM metrology provides very high resolution, it is expensive to implement and relatively slow in operation.

AFM also provides high resolution but is typically even slower than SEM. The terms "optical metrology system," "overlay metrology system" and "registration tool" are used interchangeably herein. Optical metrology systems overcome many of the problems associated with SEM and AFM metrology but are unable to resolve adequately for feature dimensions of less than about 1 $\mu$m. SEM measurements can take 8–15 seconds per measurement depending on the complexity of the task being measured, e.g., number of scans per wafer, location of measurement points, etc. AFM measurements are measured in minutes per measurement (not seconds) because of long setup times and slow scan times. A registration tool can make measurements approximately every 0.5 to 2 seconds, or at a rate of approximately 1800 to 7200 measurements per hour. Thus, registration tools are clearly faster than SEM or AFM and, hence, more suited to in-line process measurement.

State-of-the-art semiconductor devices have submicron features. Accordingly, there is a need in the art for systems and methods for monitoring pattern features with dimensions on the submicron level that are inexpensive, capable of high-speed operation and subject to automation.

U.S. Pat. No. 5,701,013 to Hsia et al. discloses a wafer metrology pattern integrating both overlay and critical dimension features for SEM and AMF measurements. The Hsia et al. pattern, or test mask target, contains lines measuring 0.25 $\mu$m, 0.3 $\mu$m and 0.5 $\mu$m in width as well as a centrally positioned box for reference. The Hsia et al. pattern is intended to be measured with a metrology tool utilizing AFM.

U.S. Pat. Nos. 5,712,707 and 5,757,507, both to Ausschnitt et al., disclose a wafer target for determining bias or overlay error in a substrate formed by a lithographic process and methods for using same. The '707 and '507 Ausschnitt et al. target includes a pair of straight vernier arrays of parallel elements, a staggered vernier array of parallel elements, and, optionally, at least one image-shortening array on the substrate. The '707 and '507 Ausschnitt et al. target allows measurement of bias and overlay error in deposited lithographic etch patterns that are human readable during substrate processing.

U.S. Pat. No. 5,805,290 to Ausschnitt et al. discloses a level-specific target array and method of optical metrology of unresolved pattern arrays. The '290 Ausschnitt et al. level-specific target array includes a first target portion with four outer arrays of parallel lines oriented coincident with the sides of a box and a second target portion with four inner arrays of discrete, square elements oriented within and concentric to the outer arrays. First and second target portions are printed on different levels during semiconductor fabrication and allow for measurement for bias and overlay error with conventional optical metrology tools and without use of SEM or AFM tools, except for calibration.

U.S. Pat. Nos. 5,953,128 and 5,976,740, both to Ausschnitt et al., disclose optically measurable, serpentine edged, reverse tone targets used in controlling focus and exposure parameters of lithographic processes and methods for using same. The '128 and '740 Ausschnitt et al. targets also disclose needle comb elements with symmetrical stepped tapering and single-sided stepped tapering. The invention provides complementary tone patterns of shapes and spaces on a resist film on a substrate. Bias and overlay errors are then measured as functions of deviations from the expected lithographic etching norms provided by the reverse patterns.

U.S. Pat. No. 6,023,338 to Bareket discloses a target, associated apparatus and methods for determining offset between adjacent layers of a semiconductor device. The Bareket target is composed of alternating periodic structures on two successive layers of a semiconductor wafer. As electron beams are scanned across the periodic gratings of the Bareket target, relative phase shift between the two layers, and hence alignment, may be determined.

Ausschnitt et al., *Seeing the Forest for the Trees: a New Approach to CD Control*, SPIE Vol. 3332, 1998, pp. 212–20, discloses optical critical dimension measurement of pattern arrays (also known as Schnitzl arrays) whose individual features need not be resolved by the metrology tool. However, Schnitzl arrays alone do not provide for registration measurements to detect bias and overlay error.

Kim et al., *Automatic In-situ Focus Monitor Using Line Shortening Effect*, SPIE Conference on Metrology, Inspection, and Process Control for Microlithography XIII, Santa Clara, Calif., March 1999, pp. 184–93, discloses a box-in-box pattern with conventional line and space patterns along edges of the inner and outer boxes. Kim et al. considered dagger (or wedge) tapered needle points to be the most sensitive to the line shortening effect. However, Kim et al. concluded that dagger needle points are impractical because of limitations in the angles allowed with most electron-beam mask generation systems, e.g., 0°, 45° and 90°. Kim et al. also contemplated the use of stair-stepped needle patterns but rejected them because of the prohibitively large electron-beam mask data size and difficulty in checking and verifying defect-free masks with complex stair-stepped needle patterns.

While these prior art approaches have addressed many problems faced by semiconductor process control engineers, there still exists a need in the art for a target or pattern that simultaneously provides for critical dimension analysis and registration measurements, that is cost effective, capable of high-speed operation, subject to in-line process automation and that can be placed in scribe lines at arbitrary locations on a semiconductor wafer.

SUMMARY OF THE INVENTION

The present invention comprises needle comb reticle patterns that allow registration measurements and CD measurements using a single registration tool at a single location on a semiconductor wafer. The needle comb reticle patterns of the present invention save time and cost by eliminating the need to make registration and CD measurements separately with different tools.

An embodiment of a needle comb reticle pattern of the present invention includes a box-in-box registration feature, surrounded on two adjacent sides by needle comb features. Another embodiment of a needle comb reticle pattern of the present invention includes a box-in-box registration feature, surrounded on two adjacent sides by needle comb features and reference bars adjacent to the other two sides of the box-in-box feature. Yet another embodiment of a needle comb reticle pattern of the present invention includes a box-in-box registration feature surrounded on all sides by needle comb features. A preferred embodiment of a needle comb reticle pattern of the present invention includes two complementary needle comb reticle subpatterns. Needle comb features on opposite sides of the box-in-box registration feature have needles pointing in the same direction.

The box-in-box feature includes an inner box and an outer box which are mutually concentric. Each needle comb feature includes a base from which stair-stepped, tapered needles extend and point toward the outer box of the box-in-box feature. These stair-stepped needles have a variable width, much smaller than length, i.e., variable width<<length. The variable width of each stair-stepped needle runs from larger-than-stepper resolution to subresolution width. When viewed with an optical tool, the comb feature will appear as an opaque bar of a width that depends on the degree to which the stepper system is in focus. The more out of focus, the narrower the width of the comb feature. The individual needles cannot ordinarily be resolved without the aid of high magnification, such as may be provided with a SEM tool.

The needle comb reticle pattern of the present invention allows use of a single registration tool to measure both wafer alignment and resolution, as characterized to critical dimension (CD), saving time ordinarily devoted to separate measurements. Furthermore, the needle comb reticle pattern may be placed anywhere on a semiconductor wafer in the scribe lines, thus, conserving wafer real estate for production devices.

During the wafer alignment process, a needle comb reticle pattern is viewed with an optical measuring device, such as a registration tool. Suitable registration tools, also known as overlay metrology systems, include, e.g., model numbers 5200XP and 5300, from KLA-Tencor, San Jose, Calif. When viewed by the registration tool, the subresolution portion of the needles within the needle comb features will appear shortened. The extent of shortening depends on the lens of the stepper tool, its optical setup and process capability. The registration tool can then measure the apparent shift in the needle comb marks relative to the center of the overlay printed at the same level. This allows for an amplified measurement in relation to the exposure system's resolution capability. Furthermore, CD and focus measurements may be taken while simultaneously measuring for registration. Using a registration tool in this way is generally faster than previous registration tools used in conjunction with SEM or AFM tools.

Reticles, fields of reticles, masks and wafers including the needle comb reticle pattern of the present invention are encompassed by the present invention. Additionally, methods of analyzing critical dimension and registration of microelectronic lithographic processes and for characterizing measurements from a needle comb reticle pattern to pattern critical dimension are also encompassed by the present invention.

These embodiments, methods and attendant advantages of the present invention will be readily understood by reading the following detailed description in conjunction with the accompanying figures of the drawings.

BRIEF DESCRIPTION OF THE DRAWINGS

In the drawings, which illustrate what is currently regarded as the best mode for carrying out the invention and in which like reference numerals refer to like parts in different views or embodiments.

DETAILED DESCRIPTION OF THE INVENTION

U.S. Pat. No. 5,701,013 to Hsia et al. and U.S. Pat. No. 6,023,338 to Bareket are expressly incorporated herein by reference for all purposes. U.S. Pat. Nos. 5,712,707, 5,757, 507, 5,805,290, 5,953,128, 5,976,740 all to Ausschnitt et al. are expressly incorporated herein by reference for all purposes. The following technical articles are also expressly incorporated herein by reference for all purposes: Ausschnitt et al., *Seeing the Forest for the Trees: a New Approach to CD Control*, SPEE Vol. 3332, 1998, pp. 212–20, and Kim et al.,

*Automatic In-situ Focus Monitor Using Line Shortening Effect,* SPIE Conference on Metrology, Inspection, and Process Control for Microlithography MuII, Santa Clara, Calif. , March 1999, pp. 184–93.

Figure 1:
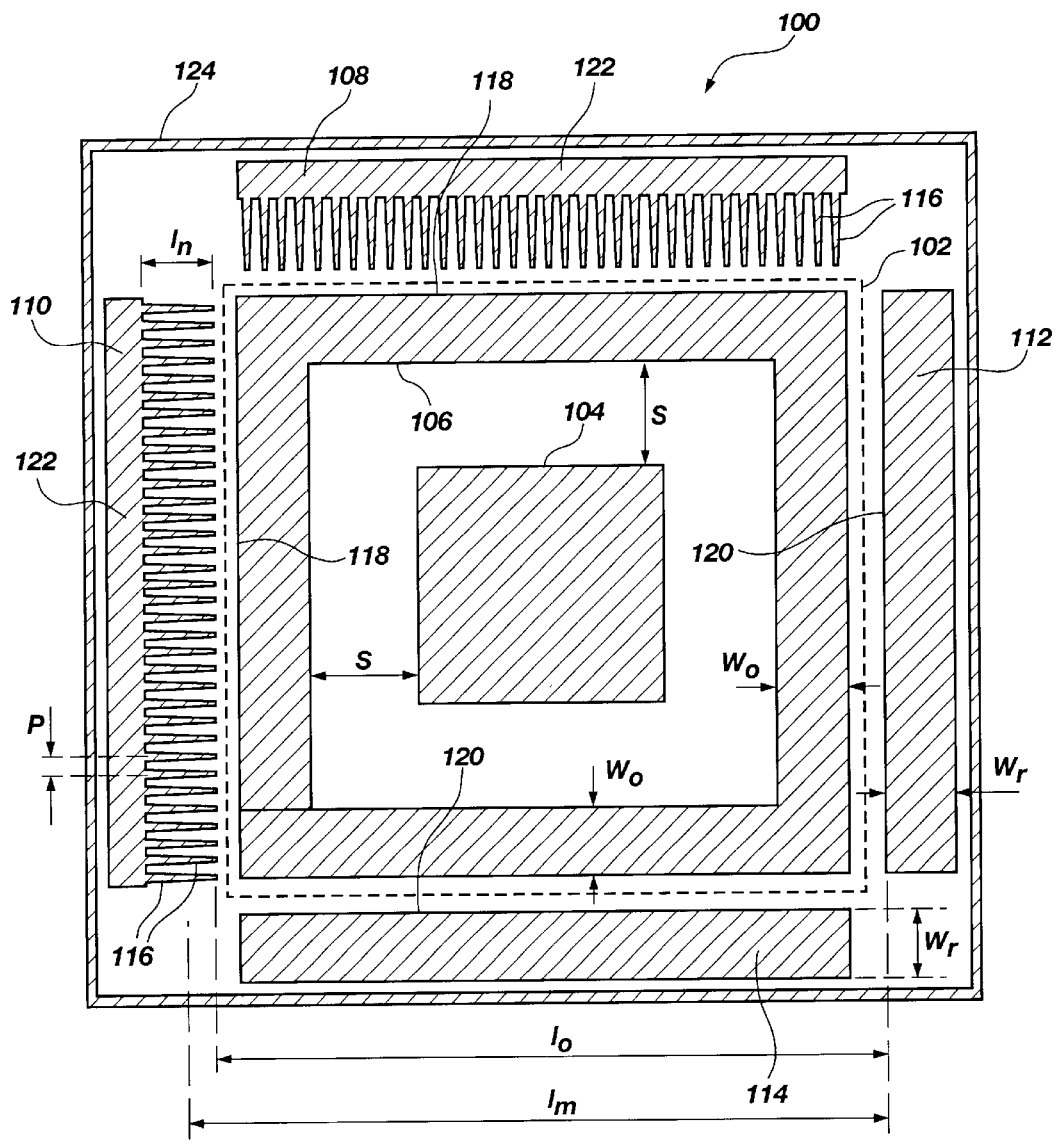
FIG. 1 is an embodiment of a needle comb reticle pattern of the present invention, including both box-in-box and needle comb features in a single pattern.

As shown in FIG. 1, an embodiment of the needle comb reticle pattern 100 of the present invention includes a box-in-box feature 102 including an inner box 104 and an outer box frame 106. Flanking the box-in-box feature 102 are needle comb top 108 and needle comb left 110. Also flanking the box-in-box feature 102 are reference bar right 112 and reference bar bottom 114. An optional outline mark 124 is also shown in FIG. 1. Reference bar right 112 functions as a solid reference mark for needle comb left 110. Reference bar bottom 114 functions as a solid reference mark for needle comb top 108. Both reference bars right 112 and bottom 114 maintain their same positions relative to the process condition. Needle comb top 108 and needle comb left 110 each include a plurality of needles 116 emanating from a solid bar base 122 and pointing inward toward the box-in-box feature 102.

The terms "needle comb reticle pattern" and "needle mark" may be used interchangeably herein. It should be understood by one of ordinary skill in the art that a needle comb reticle pattern 100, as described herein and as applied to a given reticle or mask, will alternate between merely the inner box 104 of the box-in-box feature 102 on a given layer, n, and the remaining features, i.e., the outer box frame 106 in combination with the needle combs 108, 110 and reference bars 112, 114, without inner box 104 placed on the next layer, n+1. The inner box 104 may also be referred to as a "target mark" or "target" and these terms will be used synonymously herein. The outer box frame 106 may also be referred to as an "overlay" or "overlay mark" and these terms will be used synonymously herein.

The inner box 104 of the box-in-box feature 102 is a target mark. In the preferred embodiment of the invention, inner box 104 is placed on a previous layer during semiconductor fabrication and the outer box frame 106 on the current layer is referenced to the inner box 104. The needle comb mark is printed on the same layer as the overlay mark. Perfect registration between previous and current layers will be indicated using a registration tool (not shown) where the inner box 104 appears centered inside the outer box frame 106.

For a 0.25 μfeature size semiconductor fabrication process, the length, $l_n$, of needles 116 is approximately 1.5 μm. The pitch, p, or separation of the needles 116, is approximately 0.25 μ. The points of needles 116 are spaced approximately 0.5 μfrom the outer edge 118 of outer box frame 106 and a distance, $l_o$, of approximately 18 μm from proximate edges 120 of the reference bars 112, 114. The measured length, $l_m$, (using a registration tool) will tend to be longer than the distance, $l_o$, in accordance with the line shortening effect of the needles 116 when out of focus. The inner box 104 measures approximately 7 μm on a side and has an area of approximately 49 μm². In perfect registration, an approximately 3 μm space, s, separates inner box 104 from outer box frame 106. The degree to which adjacent process layers are out of registration may be measured by the difference between the measured separation and the nominal value of s=3 μm. Outer box frame 106 has a width, $w_o$, of approximately 2 μm, as shown in FIG. 1. Reference bar right 112 and reference bar bottom 114 are both of width, $w_r$, of approximately 2 μm, as shown in FIG. 1. The entire needle comb reticle pattern 100 is substantially square in shape and measures approximately 25 μm on a side, covering an area of approximately 620 μm². However, other embodiments of a needle comb reticle pattern in accordance with the present invention may be formed of substantially octagonal or circular patterns to maximize sensitivity to lens aberrations.

A scribe line on a semiconductor wafer is approximately 50 μm to 60 μm in width and provides a boundary and point of separation between each integrated circuit die being fabricated on the semiconductor wafer. The needle comb reticle pattern 100 of the present invention is small enough to be placed on any scribe line at any location along the grid formed by the scribe lines on the wafer. Preferably, the needle comb reticle pattern 100 is placed on a scribe line and adjacent to an active component region or device pattern that forms an integrated circuit die. Once wafer processing is complete, the individual dice are singulated from the wafer by scribing the scribe lines with a diamond or other suitable scribing tool and breaking the wafer along the scribe lines or sawing through the wafer along the scribe lines. The needle comb reticle patterns 100 serve no purpose once the individual dice are singulated, so their destruction during scribing or sawing is of no consequence.

Figure 2:
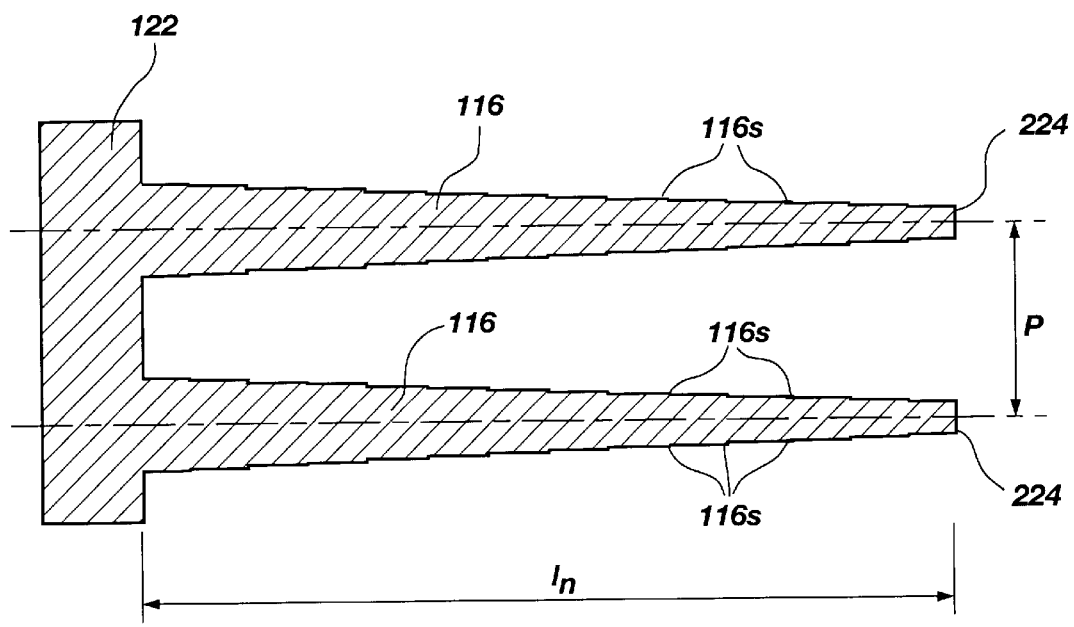
FIG. 2 is a higher magnification diagram of two comb needles from the embodiment of FIG. 1.

FIG. 2 is a high magnification view of a portion of a needle comb 108, 110 illustrating only two of the plurality of needles 116. Needles 116 may taper in width by stair-steps 116s which, as shown, may be relatively shallow. Needles 116 are widest at the solid bar base 122 of the needle combs 108, 110 and taper gradually to a flat tip 224. Flat tips 224 are preferred over acute needle points because the shallow angle formed from tip to base, for the same length, gives a greater change in needle length for the same change in resolution. While the actual taper of the needles 116 in the needle comb reticle pattern is a stair-step function, the lithographic process (electron-beam) used to fabricate the mask will smooth the transitions in the stair-steps actually produced in the mask. As noted previously, the width of each stair-stepped needle 116 varies from larger than stepper resolution to smaller than stepper resolution.

Figure 3:
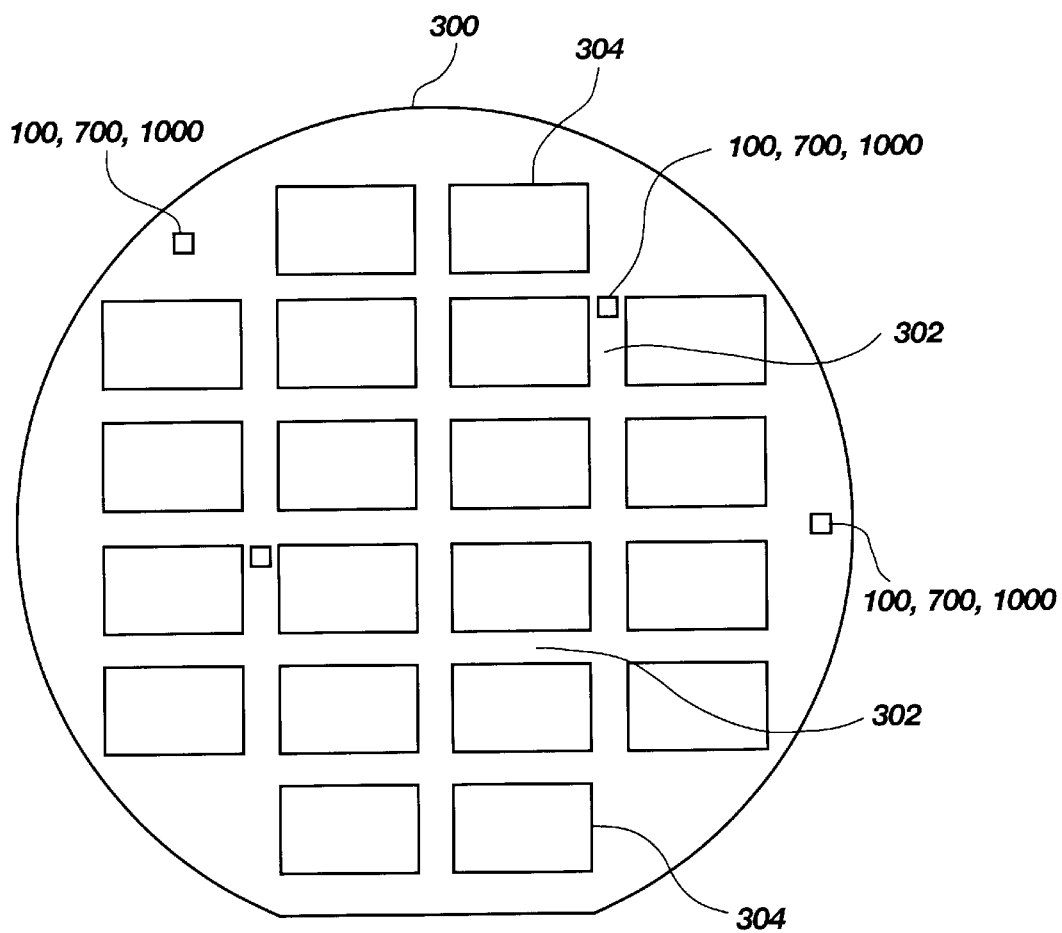
FIG. 3 is a plan view of an exemplary semiconductor wafer containing a needle comb reticle pattern in accordance with the present invention.

FIG. 3 illustrates a plan view of an exemplary semiconductor wafer 300 including one or more needle comb reticle patterns 100, 700, 1000 in accordance with the invention. The semiconductor wafer 300 includes active device patterns 304 separated by scribe lines 302. Note that the scribe lines 302 are not drawn to scale in FIG. 3, but are oversized for clarity to better illustrate the placement of needle comb reticle patterns 100, 700, 1000 on scribe lines 302. The semiconductor wafer 300 also includes needle comb reticle patterns 100, 700, 1000 either adjacent to active device patterns 304 in scribe lines 302 or in regions where an active device pattern 304 will not fit, i.e., along the perimeter of the semiconductor wafer 300. FIG. 3 may also be representative of a plan view of a mask for use in conventional optical lithography, wherein the entire surface of a semiconductor wafer is optically exposed in a single step.

Figure 4:
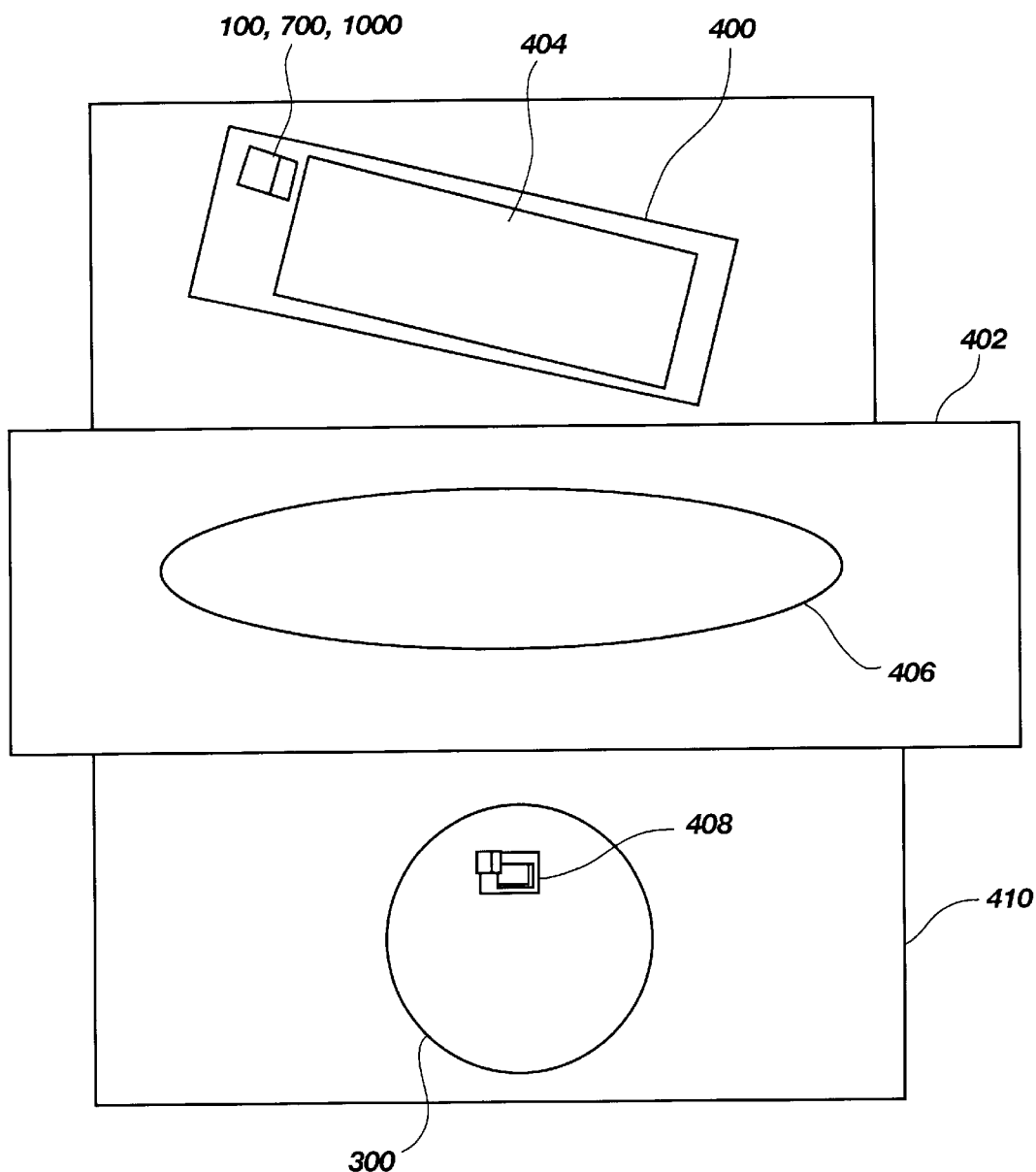
FIG. 4 is a schematic diagram illustrating the exposure process using the needle comb reticle pattern of the present invention.

Referring to, FIG. 4, a schematic diagram illustrating an exposure process using the needle comb reticle pattern 100, 700, 1000 of the present invention is shown. During semiconductor fabrication, the needle,comb reticle pattern 100, 700, 1000 is first placed on a mask or a reticle 400. The needle comb reticle pattern 100, 700, 1000, along with an active device pattern 404, is then projected onto the surface of semiconductor wafer 300 resting on a registration tool stage 410 using an exposure tool 402 during optical lithography. The eexposure tool 402 includes a lens 406 used to project the image from the reticle 400 onto the surface of the Referring to FIG. 4, a schematic diagram illustrating an exposure process using the needle comb reticle pattern 100, 700, 1000 of the present invention is shown. During semiconductor fabrication, the needle comb reticle pattern 100, 700, 1000 is first placed on a mask or a reticle 400. The needle comb reticle pattern 100, 700, 1000, along with an active device pattern 404, is then projected onto the surface of semiconductor wafer 300 resting on a registration tool stage 410 using an exposure tool 402 during optical lithography. The exposure tool 402 includes a lens 406 used to project the image from the reticle 400 onto the surface of the semiconductor wafer 300. This process may be repeated for each device pattern 404 projected onto the surface of the semiconductor wafer 300 to form an integrated circuit die 408. The process of stepping each reticle pattern is well known to one of ordinary skill in the art and, thus, will not be further detailed herein.

Figure 5:
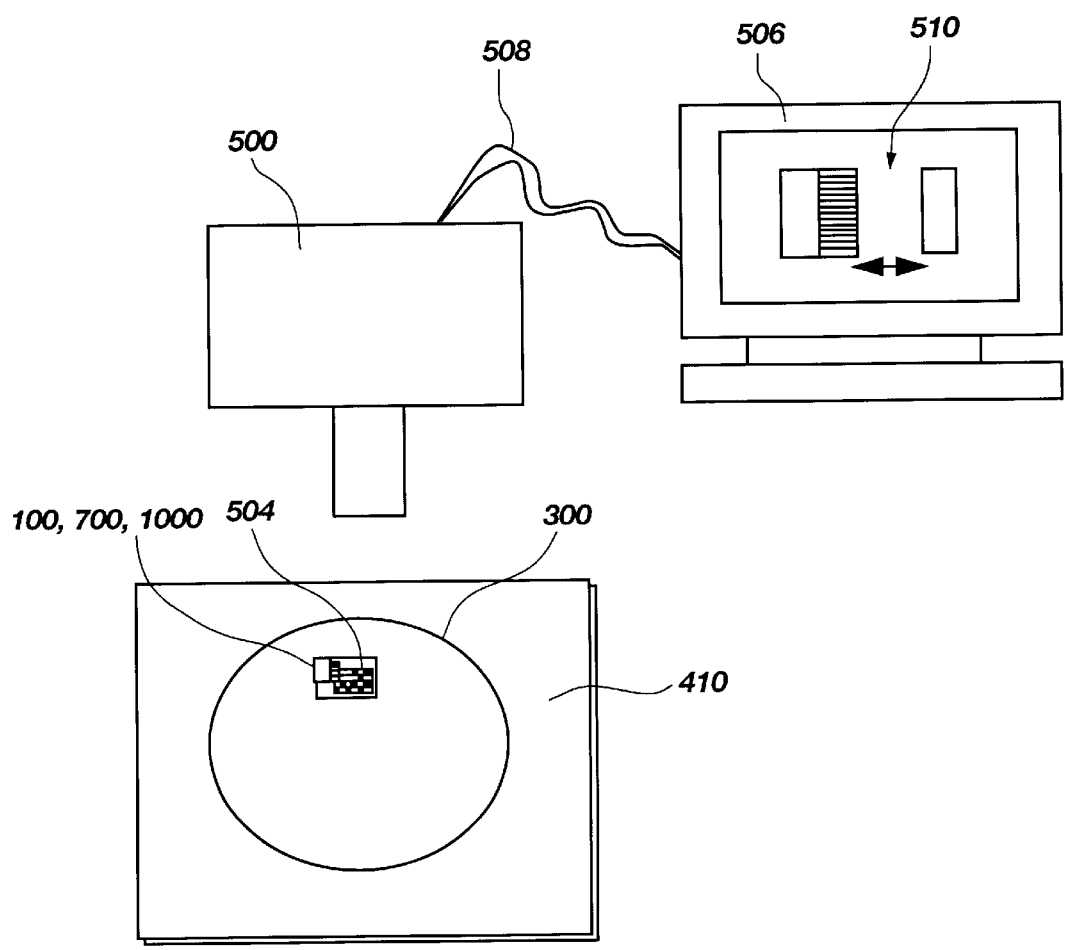
FIG. 5 is a schematic diagram of a registration tool for measuring CD and registration in accordance with the present invention.

Referring to FIG. 5, a schematic diagram of a registration tool 500 for measuring CD and registration in accordance with the invention is shown. FIG. 5 shows a registration tool 500 electrically coupled with cabling 508 to a monitor 506 for viewing a magnified needle comb reticle pattern 510 on the surface of a semiconductor wafer 300. FIG. 5 also shows a semiconductor wafer 300 on a registration tool stage 410 with at least one needle comb reticle pattern 100, 700, 1000 adjacent to an active device pattern 504, both on the surface of the semiconductor wafer. The registration tool 500 as configured in FIG. 5 may be used to simultaneously measure CD and registration.

Figure 6:
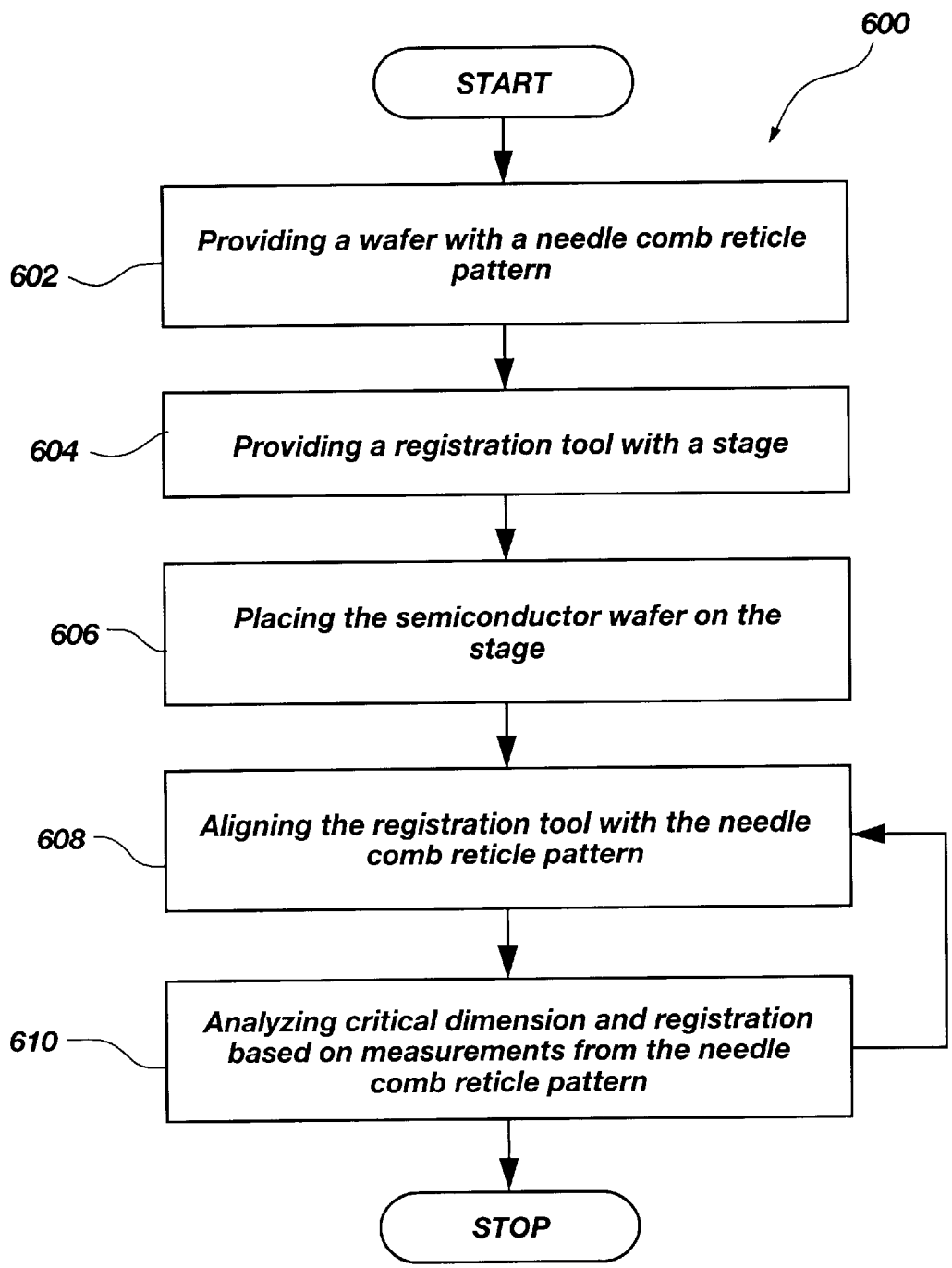
FIG. 6 is a flow chart of a method of analyzing critical dimension and registration using a single registration tool and a needle comb reticle pattern of the present invention.
Figure 7:
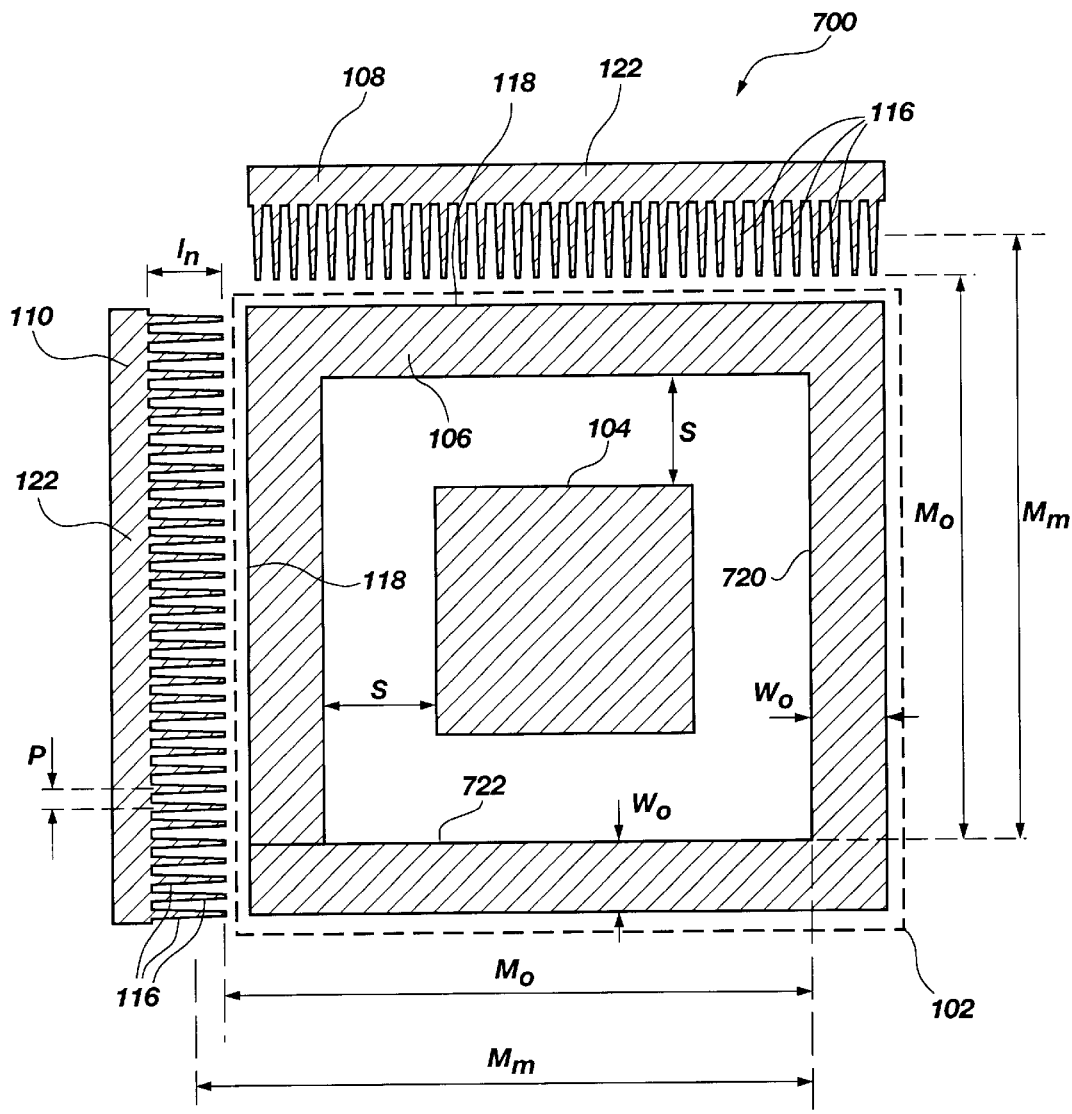
FIG. 7 is an alternative embodiment of a needle comb reticle pattern of the present invention, including both box-in-box and needle comb features in a single pattern.

FIG. 6 is a flow chart of a method 600 of analyzing CD and registration using a single registration tool and the needle comb reticle pattern of the present invention. The method includes providing a semiconductor wafer with at least one needle comb reticle pattern 602 such as that shown in FIG. 1. A registration tool 604 is provided, the tool including a registration tool stage, an optical registration tool and a monitor electrically coupled to the optical registration tool. The semiconductor wafer is placed on the registration tool stage 606. The optical registration tool is aligned with the at least one needle comb reticle pattern 608 and CD and registration are analyzed from lengths measured from the at least one needle comb reticle pattern 610. The aligning step 608 and the analyzing step 610 may be repeated, in turn, for each needle comb reticle pattern on the semiconductor wafer. Suitable registration tools for use with the in-box feature 102 are needle comb top 108 and needle comb left 110. Inner right edge 720 of outer box frame 106 functions as a solid reference mark for needle comb left 110. Inner bottom edge 722 of outer box frame 106 functions as a solid reference mark for needle comb top 108. Inner edges 720 and 722 are formed on the same layer as needle comb top 108 and needle comb left 110. Inner edges 720 and 722 also maintain their same positions relative to the process condition. Needle comb top 108 and needle comb left 110 each include a plurality of needles 116 emanating from a solid bar base 122 and pointing inward toward the box-in-box feature 102 like those described for the embodiment of FIG. 1.

For a 0.25 $\mu$m feature size semiconductor fabrication process, the length, $l_n$, of needles 116 is approximately 1.5 $\mu$m. The pitch, p, or separation of the needles 116, is approximately 0.25 $\mu$m. The points of needles 116 are spaced approximately 0.5 $\mu$from the outer edge 118 of outer box frame 106 and a distance, m., of approximately 15.5 $\mu$m from inner edges 720, 722 of outer box frame 106. The measured length of the needles 116, $m_m$, (using a registration tool) will tend to be longer than the distance, $m_o$, in accordance with the line shortening effect of the needles 116 when out of focus. The inner box 104 measures approximately 7 $\mu$m on a side and has an area of approximately 49 $\mu$m$^2$. In perfect registration, an approximately 3 $\mu$m space, s, separates inner box 104 from outer box frame 106. The degree to which adjacent process layers are out of registration may be measured by the difference between the measured separation and the nominal value of s=3 $\mu$m. Outer box frame 106 has a width, $w_o$, of approximately 2 $\mu$m, as shown in FIG. 1. The entire needle comb reticle pattern 700 is substantially square in shape and measures approximately 22 $\mu$m on a side, covering an area of approximately 480 $\mu$m$^2$.

Figure 10:
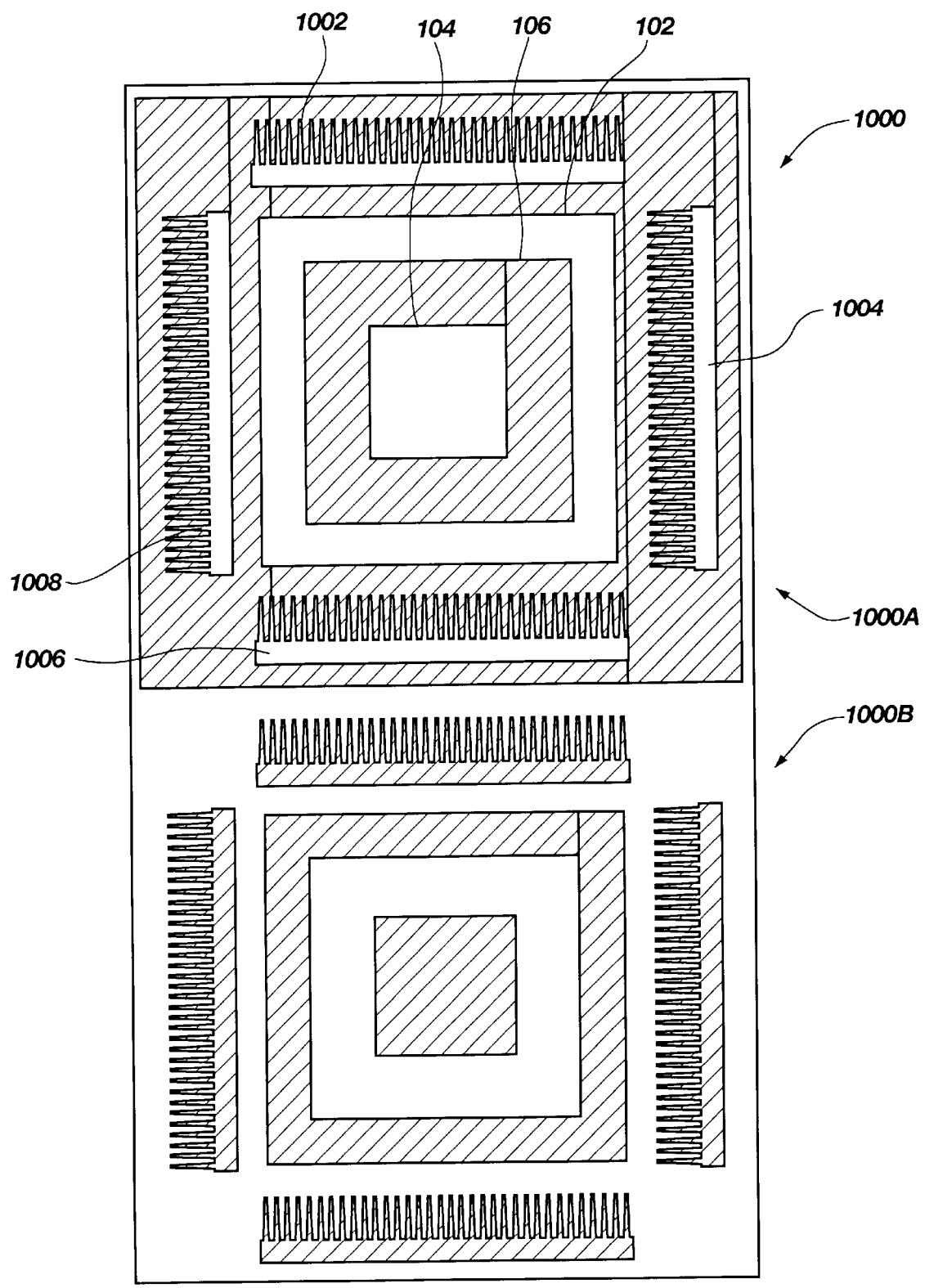
FIG. 10 is a presently preferred embodiment of a needle comb reticle pattern of the present invention.

FIG. 10 is a presently preferred embodiment of a needle comb reticle pattern 1000 of the present invention. Needle comb reticle pattern 1000 includes two complementary but identically dimensioned needle comb reticle subpatterns 1000A, 1000B. Needle comb reticle subpattern 1000A includes a box-in-box feature 102 including an inner box 104 and an outer box frame 106. Flanking the box-in-box feature 102 are needle comb top 1002, needle comb right 1004, needle comb bottom 1006 and needle comb left 1008. Note that both needle comb top 1002 and needle comb bottom 1006 have needles pointing in the same direction vertically (upward shown but downward will also work) which essentially doubles the focus measurement sensitivity vertically. Likewise note that both needle comb left 1008 and needle comb right 1004 have needles pointing in the same direction horizontally (pointing to the left shown; however, pointing to the right will also work) which essentially doubles the focus measurement sensitivity horizontally. Needle comb reticle subpattern 1000B is adjacent needle subpattern 1000A and shown below. However, needle comb reticle subpattern 1000B may abut subpattern 1000A on any side, consistent with the present invention.

On a given layer n of an integrated circuit during processing, needle combs 1002, 1004, 1006 and 1008 and box-in-box feature 102 of needle comb reticle subpattern 1000A will be printed along with the negative of the same corresponding features of needle comb reticle subpattern 1000B. This would correspond to the white or unshaded regions of FIG. 10. In contrast on layer n+1, the reverse would be printed, i.e., the shaded regions of FIG. 10. By using complementary needle comb reticle subpatterns 1000A, 1000B as a needle comb reticle pattern 1000, difficulties encountered with registration tools that require symmetrical marks can be overcome. Additionally, setup time is reduced and process control measurement jobs become more robust.

The dimensions of the needle comb reticle patterns 100, 700, 1000 described above are nominal dimensions for a single embodiment for a given process size capability. Each of the dimensions enumerated above may be varied and still remain within the scope of the invention. For example, the spacing, s, between the inner box 104 and outer box frame 106 may be changed as long as the spacing, s, is sufficient to allow for registration measurements within the ordinary registration tolerance of the particular process. Another example is the width, $w_o$, of the outer box frame 106, which width may be varied from about 0.5 $\mu$m to 5 $\mu$m without departing from the scope of the invention. Additionally, the needle comb reticle pattern 100, 700, 1000 of the present invention may be rotationally oriented at any angle without departing from the scope of the invention. One of ordinary skill in the art will also recognize that the dimensions outlined above may be scaled to accommodate higher or lower resolution lithographic processes as needed.

The needle comb reticle patterns 100, 700, 1000 of the present invention may be placed in any location on a semiconductor wafer or any other semiconductor substrate. However, the desire for cost effective semiconductor device fabrication dictates that active device surface area be maximized. Some portions of the perimeter of a wafer may not be large enough for a complete die pattern and a needle comb reticle pattern 100, 700, 1000 may be placed in such locations. The needle comb reticle patterns 100, 700, 1000 of the present invention are small enough to be placed on any scribe line at any location along the grid formed by the scribe lines on the wafer. Preferably, the needle comb reticle patterns 100, 700, 1000 are placed on a scribe line and adjacent to an active component region or device pattern that forms an integrated circuit die.

The number of needle comb reticle patterns 100, 700, 1000 that may be placed on a given layer is limited by the size of the scribe line. At least two needle comb reticle patterns 100, 700, 1000 must be placed on each layer in order to make CD and registration measurements. Preferably, four needle comb reticle patterns 100, 700, 1000 are placed in a rectangular field that includes a single active device pattern. Preferably, each of the four identical needle comb reticle patterns 100, 700, 1000 is placed in approximately each corner of the rectangular field. Preferably, at least one needle comb reticle pattern 100, 700, 1000 should be placed adjacent each device pattern on each layer during fabrication.

Figure 8:
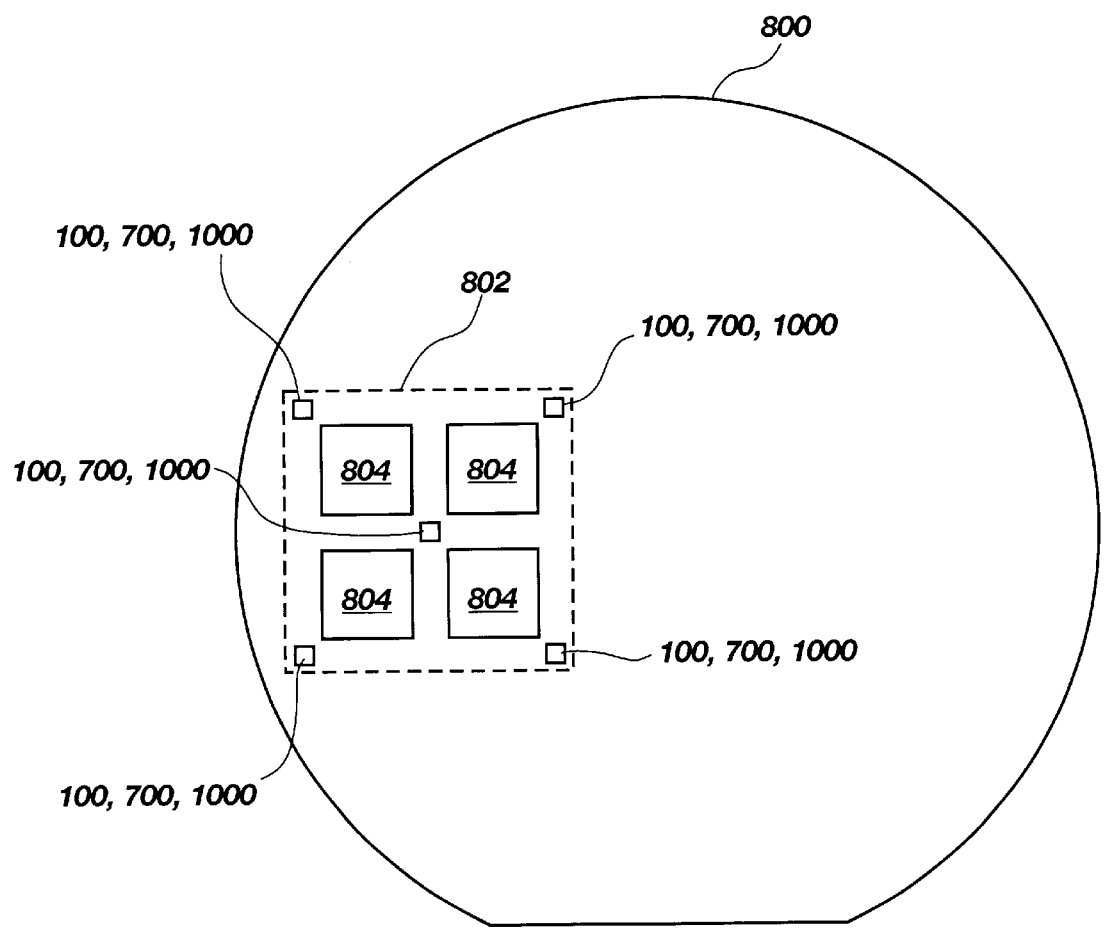
FIG. 8 is a plan view of an exemplary semiconductor wafer illustrating a field of a reticle containing at least one active device pattern and at least one needle comb reticle pattern of the present invention.

During semiconductor fabrication, a wafer 800 may be processed using a stepper and a reticle to expose a plurality of active device patterns 804, each within a field 802 of the reticle. A field 802 is a rectangular window of a reticle. FIG. 8 is a plan view of an exemplary semiconductor wafer illustrating a field 802 of a reticle containing at least one active device pattern 804 and at least one needle comb reticle pattern 100, 700, 1000 of the present invention. Depending on the size of active device patterns 804, one or more active device patterns 804 may be placed within a field 802 of a reticle in accordance with the invention. The use of a stepper with a reticle including a field 802 is within the knowledge of one of ordinary skill in the art. Preferably, each field 802 of a reticle includes a rectangular window and four needle comb reticle patterns 100, 700, 1000, one in each corner of the field 802. A fifth needle comb reticle pattern 100, 700, 1000 may be placed in the center of the field 802, depending on the configuration of active device patterns 804 within a field 802.

Figure 9:
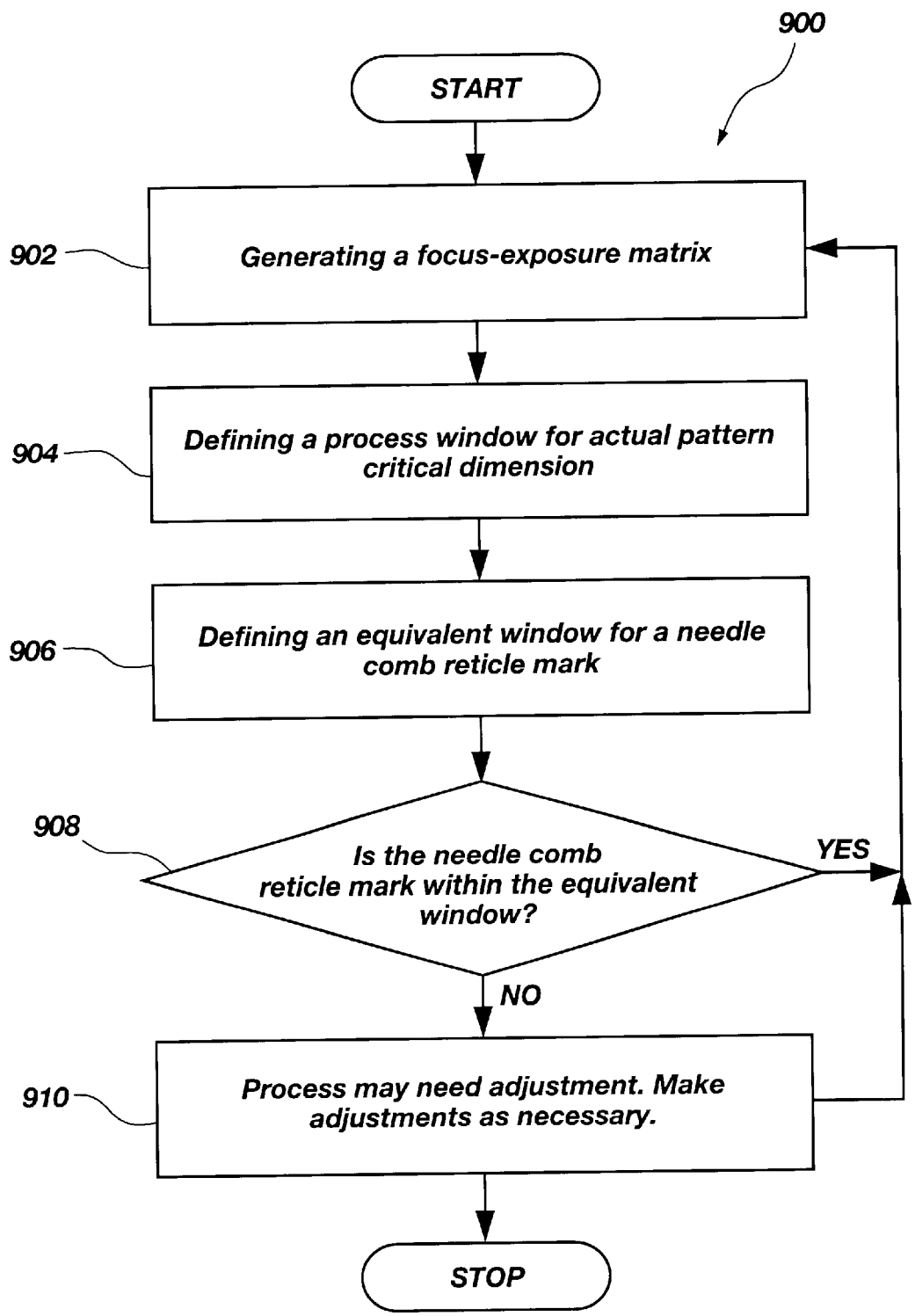
FIG. 9 is a flow chart of a method of characterizing measurements from a needle comb reticle pattern to pattern critical dimension in accordance with the present invention.

FIG. 9 is a flow chart of a method 900 of characterizing measurements from a needle comb reticle pattern to pattern critical dimension. Method 900 includes generating 902 a focus-exposure matrix, defining 904 a process window for actual pattern critical dimension and defining 906 an equivalent window for a needle comb reticle mark. Method 900 further includes determining 908 whether the needle comb reticle mark is within the equivalent window. If the needle comb reticle mark is within the equivalent window, then critical dimension will also be within the process window and there is no need to make a process control adjustment 910, i.e., the process is in control. If the needle comb reticle mark is outside the equivalent window, then there is a problem with the critical dimension measurement and the process may require a process control adjustment 910. The above procedure may be repeated as necessary for each measurement. By characterizing measurements from a needle comb reticle pattern by method 900, the need for critical dimension measurement may be reduced or eliminated.

Although this invention has been described with reference to particular embodiments, the invention is not limited to these described embodiments. Rather, the invention is limited only by the appended claims, which include within their scope all equivalent devices or methods that operate according to the principles of the invention as described herein.

What is claimed is:

1. A needle comb reticle pattern for use in process measurement during semiconductor substrate processing comprising:
    a box-in-box feature including a solid inner box having an outer periphery substantially defined by four substantially straight sides and an outer box frame having an inner periphery substantially defined by four inner substantially straight sides and an outer periphery substantially defined by four outer substantially straight sides;
    wherein the outer box frame surrounds the inner box and a gap separates the outer periphery of the inner box and inner periphery of the outer box frame;
    wherein the gap between the outer periphery of the inner box and the inner periphery of the outer box frame is substantially uniform along each side of the inner box and outer box frame;
    a first needle comb proximately flanking the outer periphery of a first side of the outer box frame; and
    a second needle comb proximately flanking the outer periphery of a second side of the outer box frame.

2. The needle comb reticle pattern of claim 1, wherein each of the first and second needle combs comprises a plurality of needles emanating from a respective solid bar base and pointing toward the box-in-box feature.

3. The needle comb reticle pattern of claim 2, wherein each of the plurality of needles tapers in width in stair-step fashion to a flat tip.

4. The needle comb reticle pattern of claim 3, wherein each of the plurality of needles tapers in width from larger than stepper resolution to smaller than stepper resolution.

5. The needle comb reticle pattern of claim 2, wherein each of the plurality of needles is approximately 1.5 $\mu$m in length.

6. The needle comb reticle pattern of claim 2, wherein the plurality of needles is mutually spaced at a pitch of approximately 0.25 $\mu$m.

7. The needle comb reticle pattern of claim 1, wherein the needle comb reticle pattern is substantially square in shape with sides of approximately 22 $\mu$m in length.

8. A semiconductor reticle used in semiconductor fabrication comprising:
    at least one active device pattern; and
    a needle comb reticle pattern adjacent to the at least one active device pattern, wherein the needle comb reticle pattern comprises:
        a box-in-box feature including a solid inner box having an outer periphery substantially defined by four substantially straight sides and an outer box frame having an inner periphery substantially defined by four inner substantially straight sides and an outer periphery substantially defined by four outer substantially straight sides;
        wherein the outer box frame surrounds the inner box and a gap separates the outer periphery of the inner box and inner periphery of the outer box frame;.
        wherein the gap between the outer periphery of the inner box and the inner periphery of the outer box frame is substantially uniform along each side of the inner box and outer box frame;
        a first needle comb proximately flanking the outer periphery of a first side of the outer box frame; and
        a second needle comb proximately flanking the outer periphery of a second side of the outer box frame.

9. The semiconductor reticle of claim 8, wherein each of the first and second needle combs comprises a plurality of needles emanating from a solid bar base and pointing toward the box-in-box feature.

10. The semiconductor reticle of claim 8, wherein each of the plurality of needles tapers in width in stair-step fashion to a flat tip.

11. The semiconductor reticle of claim 9, wherein each of the plurality of needles tapers in width from larger than stepper resolution to smaller than stepper resolution.

12. A semiconductor wafer comprising:
   at least one active device patern; and
   at least one needle comb reticle pattern adjacent to the at least one active device pattern, wherein the at least one needle comb reticle pattern comprises:
      a box-in-box feature including a solid inner box having an outer periphery substantially defined by four substantially straight sides and an outer box frame having an inner periphery substantially defined by four inner substantially straight sides and an outer periphery substantially defined by four outer substantially straight sides;
      wherein the outer box frame surrounds the inner box and a gap separates the outer periphery of the inner box and inner periphery of the outer box frame;
      wherein the gap between the outer periphery of the inner box and the inner periphery of the outer box frame is substantially uniform along each side of the inner box and outer box frame;
      a first needle comb proximately flanking the outer periphery of a first side of the outer box frame; and
      a second needle comb proximately flanking the outer periphery of a second side of the outer box frame.

13. The semiconductor wafer of claim 12, wherein each of the first and second needle combs comprises a plurality of needles emanating from a solid bar base and pointing toward the box-in-box feature.

14. The semiconductor wafer of claim 12, wherein each of the plurality of needles tapers in width in stair-step fashion to a flat tip.

15. A semiconductor mask comprising:
   at least one active device pattern; and
   at least one needle comb reticle pattern adjacent to the at least one active device pattern, wherein the at least one needle comb reticle pattern comprises:
      a box-in-box feature including a solid inner box having an outer periphery substantially defined by four substantially straight sides and an outer box frame having an inner periphery substantially defined by four inner substantially straight sides and an outer periphery substantially defined by four outer substantially straight sides;
      wherein the outer box frame surrounds the inner box and a gap separates the outer periphery of the inner box and inner periphery of the outer box frame;
      wherein the gap between the outer periphery of the inner box and the inner periphery of the outer box frame is substantially uniform along each side of the inner box and outer box fame;
      a first needle comb proximately flanking the outer periphery of a first side of the outer box frame; and
      a second needle comb proximately flanking the outer periphery of a second side of the outer box frame.

16. The semiconductor mask of claim 15, wherein each of the first and second needle combs comprises a plurality of needles emanating from a solid bar base and pointing toward the box-in-box feature.

17. The semiconductor mask of claim 16, wherein each of the plurality of needles tapers in width in stair-step fashion to a flat tip.

18. The semiconductor mask of claim 16, wherein each of the plurality of needles tapers in width from larger than stepper resolution to smaller than stepper resolution.

19. A needle comb reticle pattern for use in process measurement during semiconductor substrate processing comprising:
   a box-in-box feature including a solid inner box having an outer periphery substantially defined by four substantially straight sides and an outer box frame having an inner periphery substantially defined by four inner substantially straight sides and an outer periphery substantially defined by four outer substantially straight sides;
   wherein the outer box frame surrounds the inner box and a gap separates the outer periphery of the inner box and inner periphery of the outer box frame;
   wherein the gap between the outer periphery of the inner box and the inner periphery of the outer box frame is substantially uniform along each side of the inner box and outer box frame;
   a first needle comb proximately flanking the outer periphery of a first side of the outer box frame;
   a second needle comb proximately flanking the outer periphery of a second side of the outer box frame; and
   a first reference bar proximately flanking the outer periphery of a third side of the outer box frame;
   a second reference bar proximately flanking the outer periphery of a fourth side of the outer box frame.

20. The needle comb reticle pattern of claim 19, wherein each of the first and second needle combs comprises a plurality of needles emanating from a solid bar base and pointing toward the box-in-box feature and one of the first and second reference bars.

21. The needle comb reticle pattern of claim 20, wherein each of the plurality of needles tapers in width in stair-step fashion to a flat tip.

22. The needle comb reticle pattern of claim 21, wherein each of the plurality of needles tapers in width from larger than stepper resolution to smaller than stepper resolution.

23. The needle comb reticle pattern of claim 20, wherein each of the plurality of needles is approximately 1.5 $\mu$m in length.

24. The needle comb reticle pattern of claim 20, wherein each of the plurality of needles is mutually spaced at a pitch of approximately 0.25 $\mu$m.

25. The needle comb reticle pattern of claim 19, wherein the needle comb reticle pattern is substantially square in shape with sides of approximately 25 $\mu$m in length.

26. A semiconductor reticle used in semiconductor fabrication comprising:
   at least one active device pattern; and
   a needle comb reticle pattern adjacent to the at least one active device pattern, wherein the needle comb reticle pattern comprises:
      a box-in-box feature including a solid inner box having an outer periphery substantially defined by four substantially straight sides and an outer box frame having an inner periphery substantially defined by four inner substantially straight sides and an outer periphery substantially defined by four outer substantially straight sides;
      wherein the outer box frame surrounds the inner box and a gap separates the outer periphery of the inner box and inner periphery of the outer box frame;

wherein the gap between the outer periphery of the inner box and the inner periphery of the outer box frame is substantially uniform along each side of the inner box and outer box frame;

a first needle comb proximately flanking the outer periphery of a first side of the outer box frame;

a second needle comb proximately flanking the outer periphery of a second side of the outer box frame; and a first reference bar proximately flanking the outer periphery of a third side of the outer box frame; and a second reference bar proximately flanging the outer periphery of a fourth side of the outer box frame.

27. The semiconductor reticle of claim 26, wherein each of the first and second needle combs comprises a plurality of needles emanating from a solid bar base and pointing toward the box-in-box feature and one of the first and second reference bars.

28. The semiconductor reticle of claim 27, wherein each of the plurality of needles tapers in width in stair-step fashion to a flat tip.

29. The semiconductor reticle of claim 28, wherein each of the plurality of needles tapers in width from larger than stepper resolution to smaller than stepper resolution.

30. A semiconductor wafer comprising:
at least one active device pattern; and
at least one needle comb reticle pattern adjacent to the at least one active device pattern, wherein the at least one needle comb reticle pattern comprises:
a box-in-box feature including a solid inner box having an outer periphery substantially defined by four substantially straight sides and an outer box frame having an inner periphery substantially defined by four inner substantially straight sides and an outer periphery substantially defined by four outer substantially straight sides;
wherein the outer box frame surrounds the inner box and a gap separates the outer periphery of the inner box and inner periphery of the outer box frame;
wherein the gap between the outer periphery of the inner box and the inner periphery of the outer box frame is substantially uniform along each side of the inner box and outer box frame;
a first needle comb proximately flanking the outer periphery of a first side of the outer box frame;
a second needle comb proximately flanking the outer periphery of a second side of the outer box frame;
a reference bar proximately flan the outer periphery of a third side of the outer box frame; and
a second reference bar proximately flanking the outer periphery of a fourth side of the outer box frame.

31. The semiconductor wafer of claim 30, wherein each of the first and second needle combs comes a plurality of needles emanating from a solid bar base and pointing toward the box-in-box feature and one of the first and second reference bars.

32. The semiconductor wafer of claim 31, wherein each of the plurality of needles tapers in width in stair-step fashion to a flat tip.

33. A semiconductor mask comprising:
at least one active device pattern; and
at least one needle comb reticle pattern adjacent to the at least one active device patter, wherein the at least one needle comb reticle pattern comprises:
a box-in-box feature including a solid inner box having an outer periphery substantially defined by four substantially straight sides and an outer box frame having an inner periphery substantially defined by four inner substantially straight sides and an outer periphery substantially defined by four outer substantially straight sides;
wherein the outer box frame surrounds the inner box and a gap separates the outer periphery of the inner box and inner periphery of the outer box frame;
wherein the gap between the outer periphery of the inner box and the inner periphery of the outer box frame is substantially uniform along each side of the inner box and outer box frame;
a first needle comb proximately flanking the outer periphery of a first side of the outer box frame;
a second needle comb proximately flanking the outer periphery of a second side of the outer box frame;
a first reference bar proximately flanking the outer periphery of a third side of the outer box frame; and
a second reference bar proximately flanking the outer periphery of a fourth side of the otter box frame.

34. The semiconductor mask of claim 33, wherein each of the first and second needle combs comprises a plurality of needles emanating from a solid bar base and pointing toward the box-in-box feature and one of the first and second reference bars.

35. The semiconductor mask of claim 34, wherein each of the plurality of needles tapers in width in stair-step fashion to a flat tip.

36. The semiconductor mask of claim 34, wherein each of the plurality of needles tapers in width from larger than stepper resolution to smaller than stepper resolution.

37. A method of analyzing critical dimension and registration with needle comb reticle patterns using a registration tool, the method comprising:
providing a semiconductor wafer with at least one needle comb reticle pattern, including configuring the at least one needle comb reticle pattern to include:
a box-in-box feature including an solid inner box having an outer periphery substantially defined by four substantially straight sides and an outer box frame having an inner periphery substantially defined by four inner substantially straight sides and an outer periphery substantially defined by four outer substantially straight sides;
wherein the outer box frame surrounds the inner box and a gap separates the outer periphery of the inner box and inner periphery of the outer box frame;
wherein the gap between the outer periphery of the inner box and the inner periphery of the outer box frame is substantially uniform along each side of the inner box and outer box frame;
a first needle comb proximately flanking the outer periphery of a first side of the outer box frame; and
a second needle comb proximately flanking the outer periphery of a second side of the outer box frame;
providing a registration tool including:
a registration tool stage;
an optical registration tool; and
a monitor electrically coupled to the optical registration tool;
placing the semiconductor wafer on the registration tool stage;
aligning the optical registration tool with the at least one needle comb reticle pattern; and
analyzing critical dimension and registration from lengths measured from the at least one needle comb reticle pattern.

38. The method of claim 37, further comprising configuring the at least one needle comb reticle pattern to include a first reference bar flanking the outer periphery of a third side of the outer box frame and a second reference bar flanking the outer periphery of a fourth side of the outer box frame.

39. The method of claim 38, wherein each of the first and second needle combs comprises a plurality of needles emanating from a solid bar base and pointing toward the box-in-box feature and one of the first and second reference bars.

40. The method of claim 39, wherein each of the plurality of needles tapers in width in stair-step fashion to a flat tip.

41. The method of claim 40, wherein each of tie plurality of needles tapers in width from larger than stepper resolution to smaller than stepper resolution.

42. The method of claim 37, further comprising repeating the aligning and the analyzing for the at least one needle comb reticle pattern on the semiconductor wafer.

43. A field of a reticle comprising:
   a rectangular window encompassing a plurality of active device patterns; and
   a plurality of needle comb reticle patterns encompassed within the rectangular window and adjacent to the plurality of active device patterns, wherein each of the plurality of needle comb reticle patterns includes:
      a box-in-box feature including a solid inner box having an outer periphery substantially defined by four substantially straight sides and an outer box frame having an inner periphery substantially defined by four inner substantially straight sides and an outer periphery substantially defined by four outer substantially straight sides;
      wherein the outer box frame surrounds the inner box and a gap separates the outer periphery of the inner box and inner periphery of the outer box frame;
      wherein the gap between the outer periphery of the inner box and the inner periphery of the outer box frame is substantially uniform along each side of the inner box and outer box frame;
      a first needle comb proximately flanking the outer periphery of a first side of the outer box frame; and
      a second needle comb proximately flanking the outer periphery of a second side of the outer box frame.

44. The field of a reticle of claim 43, wherein the plurality of needle comb reticle patterns comprises four needle comb reticle patterns, each of which is located near a corner of the rectangular window.

45. A field of a reticle comprising:
   a rectangular window encompassing a plurality of active device patterns; and
   a plurality of needle comb reticle patterns encompassed within the rectangular window and adjacent to the plurality of active device patterns, wherein each of the plurality of needle comb reticle patterns includes:
      a box-in-box feature including a solid inner box having an outer periphery substantially defined by four substantially straight sides and an outer box frame having an inner periphery substantially defined by four inner substantially straight sides and an outer periphery substantially defined by four outer substantially straight sides;
      wherein the outer box frame surrounds the inner box and a gap separates the outer periphery of the inner box and inner periphery of the outer box fame;
      wherein the gap between the outer periphery of the inner box and the inner periphery of the outer box frame is substantially uniform along each side of the inner box and outer box frame;
      a first needle comb proximately flanking the outer periphery of a first side of the outer box frame;
      a second needle comb proximately flanking the outer periphery of a second side of the outer box frame;
      a first reference bar proximately flanking the outer periphery of a third side of the outer box frame; and
      a second reference bar proximately flanking the outer periphery of a fourth side of the outer box frame.

46. The field of a reticle of claim 45, wherein the plurality of needle comb reticle patterns comprises four needle comb reticle patterns, each of which is located near a corner of the rectangular window.

47. A needle comb reticle pattern for use in process measurement during semiconductor substrate processing comprising:
   a first needle comb reticle subpattern comprising:
      a box-in-box feature including a solid inner box having an outer periphery substantially defined by four substantially straight sides and an outer box frame having an inner periphery substantially defined by four inner substantially straight sides and an outer periphery substantially defined by four outer substantially straight sides;
      first and second needle combs proximately flanking the outer box frame on two opposite peripheral sides of the outer box frame having needles aligned with an axis connecting the first and second needle combs and the inner box; and
      third and fourth needle combs flanking the outer box frame on two other opposite peripheral sides of the outer box frame having needles aligned with an axis connecting the third and fourth needle combs and the inner box; and
   a second needle comb reticle subpattern adjacent to a single side of the first needle comb reticle subpattern having substantially identically dimensioned complementary features relative to the first needle comb reticle subpattern.

48. A method of characterizing measurements from a needle comb reticle pattern to pattern critical dimension comprising:
   generating a focus-exposure matrix;
   defining a process window for actual pattern critical dimension;
   defining an equivalent window for a needle comb reticle mark wherein the needle comb reticle mark includes a box-in-box feature including:
      a solid inner box having an outer periphery substantially defined by four substantially straight sides and an outer box frame having an inner periphery substantially defined by four inner substantially straight sides and an outer periphery substantially defined by four outer substantially straight sides;
      wherein the outer box frame surrounds the inner box and a gap separates the outer periphery of the inner box and inner periphery of the outer box frame;
      wherein the gap between the outer periphery of the inner box and the inner periphery of the outer box frame is substantially uniform along each side of the inner box and outer box frame;
      a first needle comb proximately flanking the outer periphery of a first side of the outer box frame;
      a second needle comb proximately flanking the outer periphery of a second side of the outer box frame;

determining whether the needle comb reticle mark is within the equivalent window; and if the needle comb reticle mark is inside the equivalent window, then critical dimension will also be within the process window, indicating process is in control; and if the needle comb reticle mark is outside the equivalent window, then critical dimension will also be outside the process window, indicating the process needs adjustment.

* * * * *